Figure 1:
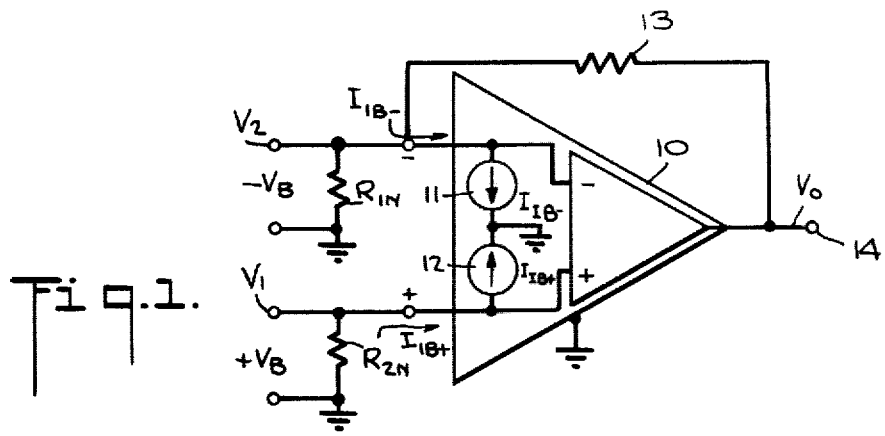

United States Patent [19]

Michel et al.

[11] 4,315,210

[45] Feb. 9, 1982

[54] BRIDGE-BALANCING SYSTEM FOR MEASURING EXTREMELY LOW CURRENTS

[75] Inventors: Thomas J. Michel, Hialeah; Robert Clarke, Cooper City, both of Fla.

[73] Assignee: Santek, Inc., Hollywood, Fla.

[21] Appl. No.: 110,251

[22] Filed: Jan. 7, 1980

[51] Int. Cl.³ .................... G01R 27/00; G01R 27/02
[52] U.S. Cl. .............................. 324/57 R; 324/65 R
[58] Field of Search .......... 324/158 T, 57 R, DIG. I, 324/65 R; 73/765, 777; 330/2

[56] References Cited

FOREIGN PATENT DOCUMENTS 1249566 9/1967 Fed. Rep. of Germany ... 324/DIG. 1
197708 8/1977 U.S.S.R. .................... 324/DIG. 1

Primary Examiner—Ernest F. Karlsen
Attorney, Agent, or Firm—Michael Ebert

[57] ABSTRACT

A bridge-balancing system for measuring minute current flows in devices having an extremely high impedance, the bridge having two sets of opposing arms to define input and output diagonals. A direct voltage is applied to the input diagonals and an amplifier having a high input impedance is connected to the output diagonals to yield an analog signal whose sense and magnitude depend on the degree to which the impedance of the device under test which forms one arm in one set differs from that of an adjustable high-impedance element forming the opposing arm of that set, a pair of fixed matching resistors defining the arms of the other set. The adjustable element is constituted by a field effect transistor operating in its variable resistance region wherein the extremely high impedance presented thereby depends on the applied gate potential. In the manual mode of the system, the impedance of the device under test is determined by varying the potential applied to the gate until a point is reached at which the signal is nulled and the bridge is in balance, at which point the impedance of the transistor matches that of the device under test and has a value which is a function of the applied gate potential. In the automatic mode, the analog signal is converted into a corresponding digital value which is evaluated in a microprocessor to determine the potential required to effect nulling, the microprocessor yielding a digital instruction that is converted into an analog control signal which is applied to a correction amplifier that imposes a nulling potential on the gate.

7 Claims, 5 Drawing Figures

BRIDGE-BALANCING SYSTEM FOR MEASURING EXTREMELY LOW CURRENTS

BACKGROUND OF THE INVENTION

1. Field of Invention

This invention relates generally to the measurement of minute currents in the sub-nanoampere range flowing through extremely high impedances, and more particularly to a digitallynulled high-impedance current measuring bridge system which functions to null out parasitic and other spurious currents to provide precise current measurements.

2. Prior Art

The concern of the present invention is with the measurement of minute bias currents which flow in semiconductor devices having an extremely high impedance. While the invention is useful in measuring currents in unipolar transistors and other high impedance devices, for purposes of explanation it will be described in conjunction with a device under test (DUT) which takes the form of a linear operational amplifier having a fieldeffect transistor (Bi-FET) input stage. A measuring system in accordance with the invention takes into account certain problems which are encountered in such amplifiers and is therefore particularly useful in the testing thereof.

A solid-state operational amplifier is a direct-coupled high-gain amplifier that is designed to use external feedback to control its feedthrough characteristics. Because an amplifier of this type is generally used to perform a wide variety of linear functions, it is often referred to as the basic linear integrated circuit. The integrated operational amplifier has gained broad acceptance as a versatile and predictable system building block, for it affords all of the advantages of monolithic integrated circuits, including reduced cost, temperature tracking and low offset voltage and current.

Operational amplifiers have a differential input, a voltage $V_2$ being applied to the inverting or (−) input and a voltage $V_1$ being applied to the non-inverting or (+) input. In an ideal operational amplifier, the input impedance has an infinite value and a zero output voltage $V_o$ when input voltage $V_1$ equals input voltage $V_2$. But a real operational amplifier exhibits offset error-voltage and currents as a result of a mismatch of the input transistors. This mismatch gives rise to unequal bias currents flowing through the input terminal. It requires, therefore, the application between the two input terminals of an input offset voltage to balance the amplifier output.

In an operational amplifier, the input bias current $I_B$ is part of the sum of the separate currents entering the two input terminals of a balanced amplifier. Thus the input bias current $I_B$ equal $I_{B1}$ plus $I_{B2}$ divided by 2, when output voltage $V_o=0$. The input offset current $I_{IO}$ is the difference between the separate currents entering the input terminals of a balanced amplifier. Hence $I_{IO}=I_{B1}-I_{B2}$, when $V_o=0$. The input offset current drift is the ratio of the change of input offset current to a change in temperature.

The metal-oxide-silicon, insulated-gate, field-effect transistor (MOS-FET) is quite different both in its structure and characteristics from the conventional bipolar junction transistor, and its unique properties are especially useful in operational amplifiers. One important characteristic of the field-effect transistor is its extremely high input impedance at low frequencies, which makes it the semiconductor counterpart of a vacuum-tube triode. Essentially, there is no d-c coupling through the insulated gate, and typical impedances are in the order of $10^{15}$ ohms.

For the purpose of testing operational amplifiers for input bias current, several techniques are presently used. These known techniques, some of which will later be described, are incapable of precisely measuring the bias current in a Bi-FET operational amplifier. The bias currents which flow through such extremely high input impedances lie in the sub-nanoampere or picoampere range, and the measurements carried out by existing techniques are uncertain in that they fail to take into account spurious components introduced by leakage and parasitic currents. Also ionization conditions prevailing in the atmosphere in which the device is being tested may give rise to an ionization current flow at the terminals of the amplifier.

The spurious current component is extremely small; but since the bias current through the high-impedance device under test lies in the sub-nanoampere range, the spurious current component represents a significant fraction of the total current flow. Unless the spurious current component is taken into account, it gives rise to a misleading result.

SUMMARY OF THE INVENTION

In view of the foregoing, the main object of this invention is to provide a bridge balancing system which is capable of accurately measuring extremely low currents.

More particularly, it is an object of this invention to provide a bridge system for measuring parameters such as bias current in the extremely high input impedance circuit of a Bi-FET linear operational amplifier, the system taking into account minute parasitic and leakage currents in making measurements of devices whose bias currents have picoampere or subnanoampere intensities.

Yet another object of the invention is to provide a bridge balancing system in which a device under test having an extremely high impedance of unknown value is included in one arm of a bridge, which device is balanced in an opposing arm by a field-effect transistor operating in its variable resistance region, the extremely high impedance presented by this transistor being controllable by varying the gate potential thereof.

Also an object of the invention is to provide a system of the above type which makes it possible to carry out reliable high impedance measurements within a short period, thereby avoiding slow changes in temperatures and variations in ambient conditions in the course of the test that may adversely influence the value being measured.

Briefly stated, these objects are accomplished in a bridge-balancing system having two sets of opposing arms forming input and output diagonals, a constant direct voltage being applied to the input diagonals and an amplifier having a high input impedance being connected to the output diagonals to yield an analog signal whose sense and magnitude depend on the degree to which the impedance of the device under test which forms one arm in one set differs from that of an adjustable high impedance element forming the opposing arm of that set, the opposing arms of the second set being defined by a pair of fixed matched resistors.

The adjustable element in the bridge is constituted by a field-effect transistor operating in its variable resistance region wherein the extremely high impedance presented thereby depends on the applied gate potential. In the manual mode of the system, the impedance of the device under test is determined by varying the potential applied to the gate until a point is reached at which the signal is nulled and the bridge is in balance, at which point the impedance of the transistor matches that of the device under test and has a value which is a function of the applied potential.

In the automatic mode of the system, the analog bridge signal must be converted into digital terms in order to be processed by a sample data system, such as a microprocessor. This conversion is accomplished by an analog to digital converter, or A/D. Certain microprocessor models have these A/D converters built on the same chip. There are however any number of discrete A/D converters which may be used for this purpose. The A/D converter samples the input analog potential which represents the imbalance of the bridge. This data may be converted by any one of several known techniques, such as dual-slope integration, voltage to frequency, parallel, servo or ramp, and the successive-approximation method.

One of the faster A-D conversion techniques is the successive-approximation approach. This method is superior because its output is a readable binary code that requires no additional processing in order to transfer the digital words representing the voltage or current imbalance of the bridge. These digital words can now be transferred into a memory, clocked out and compared word-for-word with data previously established in the microprocessor. The advantage of this technique is that the reference data can be changed at will by the software instructions to the microprocessor. Also the system parameters may be altered by the software instructions, i.e. to print out the data or to set high and low limits for certain DUT's. The use of the microprocessor allows complete control of the system with regard to imbalance of the bridge and the readout of the bias current.

In order to correct for the spurious current component in the device under test, which component otherwise introduces an ambiguity in the measurement of an extremely high impedance having a bias current flowing therethrough in the sub-nanoampere range, bridge nulling in the automatic mode is carried out in two phases; in the first of which the device under test is coupled to the bridge through an extremely high impedance switch to isolate the device from the bridge, the bridge then being nulled with respect to the spurious current component by imposing a potential on the transistor gate which balances the bridge. In the second phase, the device under test is directly coupled into the bridge and the bridge is again nulled, the gate potential change necessary to this end reflecting only the bias current.

OUTLINE OF DRAWINGS

Figure 2:
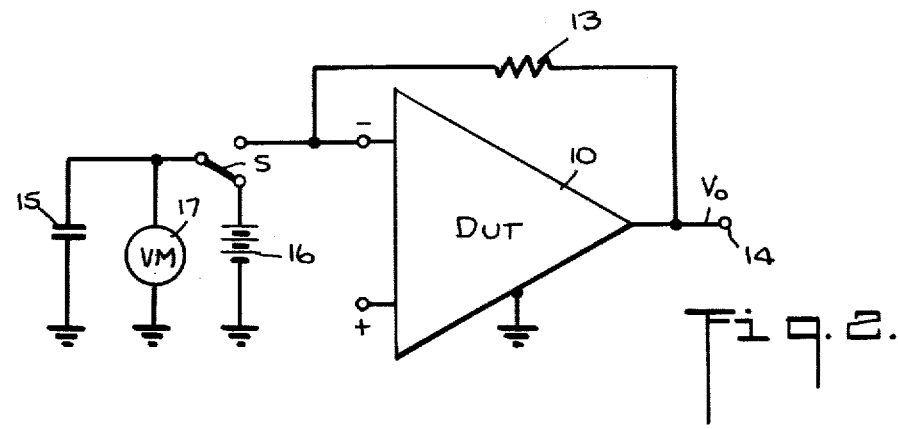
Figure 4:
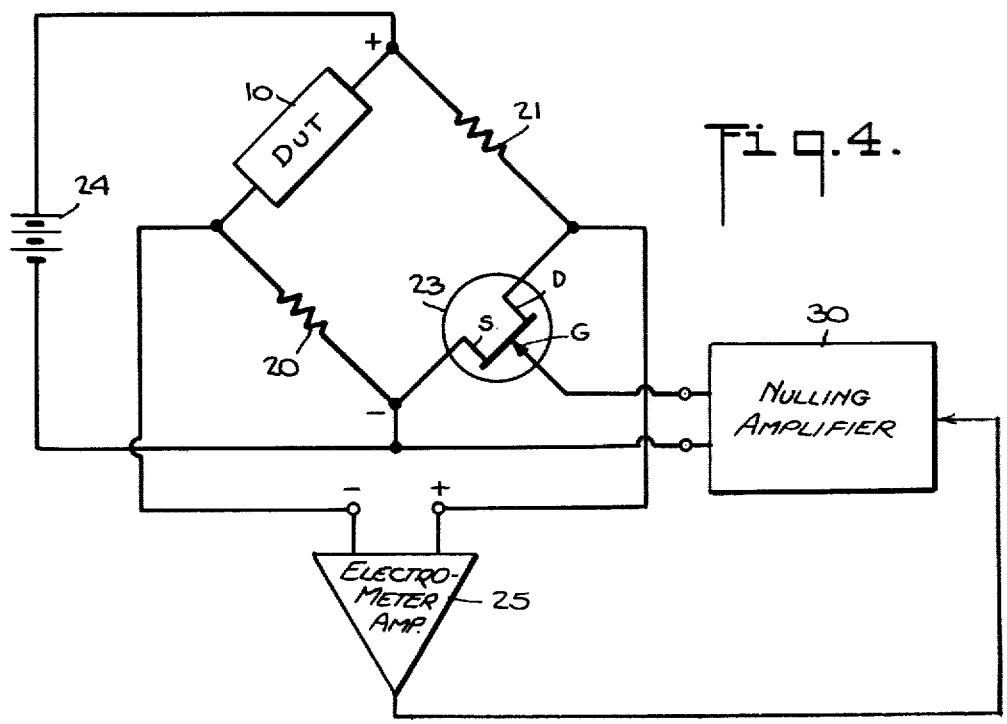
Figure 4:
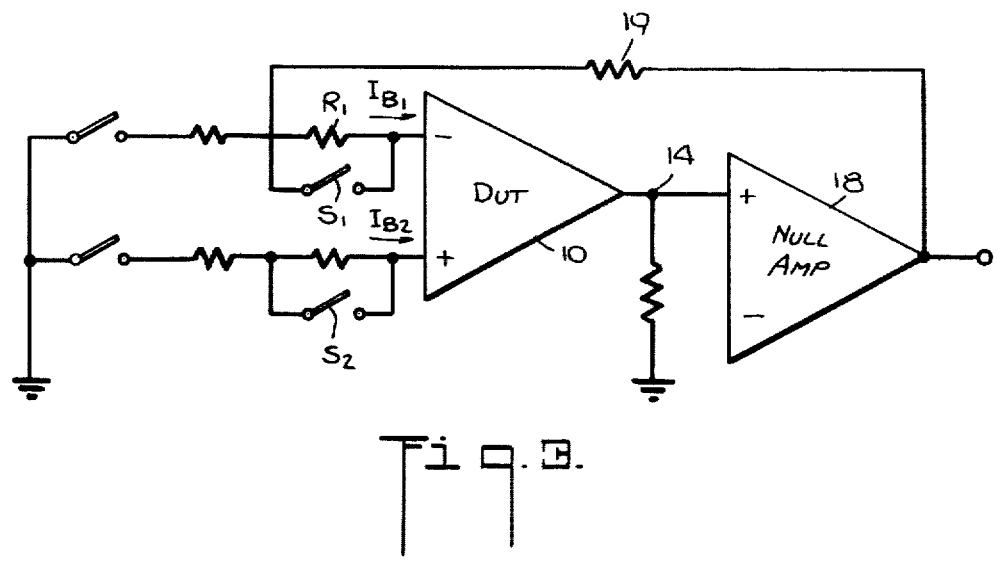
Figure 5:
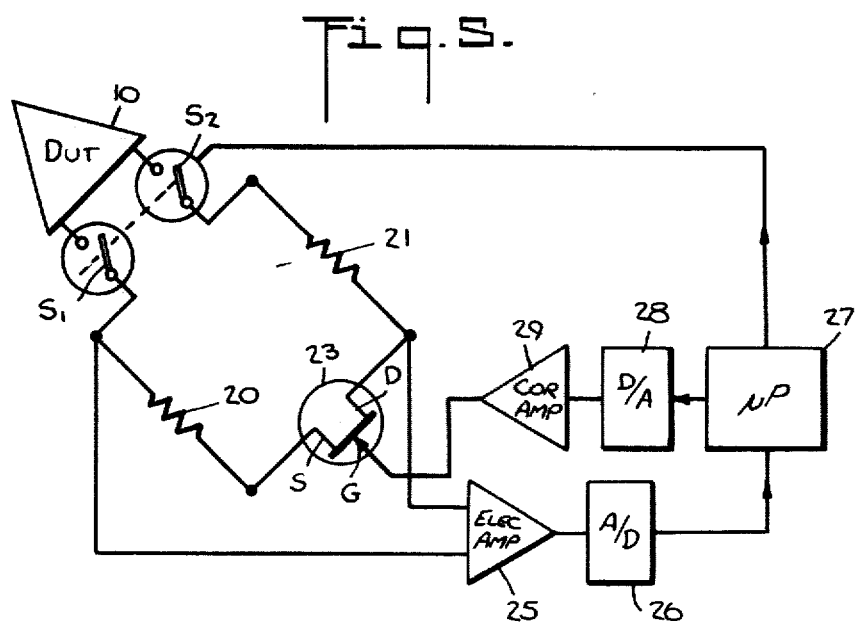

For a better understanding of the invention as well as other objects and further features thereof, reference is made to the following detailed description to be read in conjunction with the accompanying drawings wherein:

FIG. 1 schematically shows a conventional Bi-FET operational amplifier and bias currents flowing therein;

FIG. 2 schematiclly illustrates one known form of high impedance measuring arrangement;

FIG. 3 shows a second known form of high impedance testing arrangement;

FIG. 4 schematically shows a bridge balancing system in accordance with the invention for measuring extremely high impedance, the system operating in the manual mode; and FIG. 5 is a schematic diagram of the bridge balancing system operating in the automatic mode.

DESCRIPTION OF INVENTION

Before considering how a system in accordance with the present invention functions to measure parameters such as a bias current $I_B$ in a very high impedance semiconductor device (i.e., a Bi-FET linear operational amplifier), we shall with reference to FIG. 1 illustrate schematically an operational amplifier 10 having an inverting input (−) and a non-inverting input (+).

The input d-c bias current of an operational amplifier is the base current of the bi-polar input transistor or the gate leakage current of the input FET's. These bias currents $I_{IB-}$ and $I_{IB+}$ flow in the input terminals of the operational amplifier and they can therefore be shown as current sources 11 and 12 in parallel with each input lead of an ideal operational amplifier. FIG. 1 illustrates a model configuration of an operational amplifier which includes a feedback resistor 13 between the output terminal 14 and the inverting input terminal (−).

We shall now in connection with FIG. 2 consider one well-known technique for measuring picoampere or sub-nanoampere bias currents in operational amplifier 10. In this arrangement, a precision capacitor 15 is charged by a constant voltage source 16 and connected by a switch S to an input terminal of the amplifier. Connected across capacitor 15 is a high-impedance vacuum tube voltmeter (VM) 17. This voltmeter functions to indicate the voltage established across the capacitor as the bias current drawn by the operational amplifier acts to reduce this voltage. With this test arrangement, an equation or graph can be developed which, by secondary measurement, will show the approximate bias current to the input of amplifier 10.

This bias current test method suffers from several serious drawbacks. To begin with, one is faced with the nonlinearity of the voltage-current relationship of capacitor 15. Then there is the non-linearity of the temperature coefficients of both capacitor 15 and voltmeter 17, as well as the input of the semiconductor junctions which form the front end stages of the operational amplifier.

And because the input impedance of the amplifier is extremely high and the bias current is extremely minute, the resultant time constant for even a small capacitor is very large. Thus the best approximation one can attain with this known measuring technique is a non-linear, long-time interpolation and averaging of the voltage decay across the charged capacitor. Another factor which comes into play is interval leakage current of the capacitor, and it is therefore quite difficult to run the same test many times with any degree of repeatability and obtain exactly the same answer.

The time required to complete measurement is another factor that must be taken into account. The charged capacitor measurement technique entails a significant amount of time to run a test, during which period the junction of the device under test itself starts to heat up and therefore departs from the normal 25° C. temperature usually specified for testing. Thermal nonlinearity tends to increase the bias current, introducing a further complication in this test procedure. In addition to thermal problems in the device under test, ambient temperature swings at these extremely high impedances can induce a shift in the air ionization level which in turn can give rise to a shift in the atmospheric leakage around the device and increase the total current, even though the increased current is not necessarily flowing through the bias junction.

Thus in carrying out bias current measurements with a charged capacitor, one does not know to what extend the reading reflects the bias current of interest as distinguished from spurious or parasitic currents arising from diverse sources.

Another widely practiced technique for measuring minute current flows in extremely high impedance devices is shown in FIG. 3, where the device under test is again operational amplifier 10 whose output terminal 14 in this instance is connected to a nulling amplifier 18 whose output is fed through a feedback resistor 19 to the inverting input (−) of operational amplifier 10. In this arrangement, the ohmic value of the feedback resistor must be extremely high, which gives rise to temperature coefficient, noise and stability problems.

In this test arrangement, nulling amplifier 18 controls operational amplifier 10 through the negative feedback path by adjusting the offset voltage of the operational amplifier. The input bias currents $I_{B1}$ and $I_{B2}$ are measured by means of switch $S_1$ connected across resistor $R_1$ in the inverting input lead and switch $S_2$ connected across resistor $R_2$ in the non-inverting input lead.

When switches $S_1$ and $S_2$ are closed, no bias currents flow through the then shorted resistors $R_1$ and $R_2$. When these switches are open, the current equals the offset current. When switch $S_1$ is open and switch $S_2$ is closed, then bias current $I_{B1}$ is the inverting input bias current; whereas when switch $S_1$ is closed and switch $S_2$ is open, then bias current $I_{B2}$ in the non-inverting input is measured.

This technique suffers from the same drawbacks as those described in connection with the FIG. 2 arrangement, for no provision is made to correct for the spurious current component. Since spurious current flow assumes a significant level when the bias current to be measured is below 1 nanoampere ($1 \times 10^{-9}$ amps), the prior art measuring techniques leave much to be desired in terms of precision.

Referring now to FIG. 4, there is shown a Wheatstone bridge circuit in accordance with the invention wherein currentnulling is used to determine the extremely high impedance input value of the device under test, which is assumed to be an operational amplifier 10. The bridge is provided with a pair of fixed resistors 20 and 21 having matching ohmic values in opposite arms thereof, and a variable impedance element 23 in the arm opposite the device under test. A direct voltage source 24 is connected to the input diagonals of the bridge, the output diagonals being connected to a galvanometer 25 having a very high input impedance. The use of a high-input impedance galvanometer or other amplifying indicator is essential to the invention, for a low impedance imposed on the output diagonals of the bridge would render it insensitive to extremely high input devices under test.

Inasmuch as the device under test (DUT) has an extremely high impedance whose value is to be determined, it is necessary that the variable impedance element which acts to balance the bridge be capable of matching the existing value of DUT and that it be adjustable within a range which is broad enough to encompass whatever unknown value of high impedance that is being tested.

To accomplish this purpose, the variable impedance element 23 is the non-linear junction of a field-effect transistor whose impedance depends on the voltage applied to the gate thereof.

The main distinction between an MOS field effect transistor and a vacuum tube triode is that the gate electrode G of the transistor modulates the conductivity of the semiconductive region between the two-current carrying electrodes (drain D and source S), whereas the grid in a triode establishes a retarding potential field impeding the flow of elecrons traveling between its cathode and anode.

The three terminal electrical characteristics of an MOS-FET are also quite different from those of a vacuum tube triode; for when the drain current is plotted against the applied drain-to-source voltage for varying values of gate-to-source voltage, the observed characteristics usually exhibit current saturation at values of drain voltage approximately equal to the gate voltage minus the threshold voltage.

The three terminal characteristics of an MOS-FET falls into three distinct regions. The first is the variable-resistance region; for at values of applied drain voltages small enough to be much less than the magnitude of the gate voltage minus the threshold voltage, the drain current at a constant gate voltage will increase linearly with the increasing drain voltage. In this region, the MOS transistor behaves like a voltage-responsive variable resistor, with the drain-to-source resistance diminishing steadily with rising values of gate-to-source potential.

When the applied drain-to-source voltage is increased to a level greater than the gate voltage minus the threshold voltage, the drain current reaches saturation and becomes relatively constant and independent of drain voltage, the MOS then operating in the saturated-current flow region. At very large values of applied drain voltage, avalanche breakdown of the drain diode occurs and the drain current then begins to rise rapidly with increasing drain voltage, this being the avalanche breakdown region.

In a bridge system in accordance with the invention in which the device under test 10 is an extremely high impedance device and the variable impedance element 23 to balance the bridge is an FET operating in its variable resistance region, the d-c voltage developed across the output diagonals of the bridge whose polarity and magnitude depend on the degree to which the impedance of device 10 differs from that of FET 23 is sensed and indicated by the high impedance galvanometer 25. Nulling amplifier 30 is adapted to apply to the gate G of FET 23 a potential whose magnitude is such as to adjust the impedance of the FET to a value matching that of the unknown impedance under test, at which point the bridge is in balance.

Galvanometer 25, to sense and indicate the analog voltage developed across the output diagonals of the bridge, may in practice be constituted by an electrometer of the type included in the 700 ION FLUX METER manufactured and sold by SANTEK, Inc. of Hollywood, Florida. Since the circuit of this commercially-available electrometer forms no part of the present invention, its details will not be further described, except to note that the frequency response of this meter is DC to 5 Hz, and its input impedance is $>1 \times 10^{10}$ ohms. Thus the front end of the electrometer presents a very high input impedance and does not, therefore, load the bridge circuit.

In FIG. 5, there is shown a balancing bridge system which includes an FET adjustable impedance 23 in accordance with the invention and which is operable in a two-phase automatic mode to first null out background and parasitic leakage current or spurious current components before measuring the bias current flow in the DUT which again is a Bi-FET operational amplifier 10.

In this arrangement, the DUT 10 inverting and noninverting terminals are coupled to the bridge through highimpedance switches $S_1$ and $S_2$, respectively, which when open serve to isolate the DUT from the bridge through an extremely high impedance. When switches $S_1$ and $S_2$ are closed, the DUT is directly connected to the bridge. These switches are constituted by hermetically sealed devices which are isolated from the atmosphere.

The high impedance input of electrometer 25 in this instance is coupled to an analog-to-digital converter 26, which converts the analog signal from the amplifier into a corresponding digital value, the output of A/D converter 26 being supplied into a microprocessor 27 and evaluated therein for "zero." The appropriate levels and polarities are determined by the microprocessor which yields a correction factor digital instruction that is converted by a digital-to-analog converter 28 into a control signal. This control signal is applied to a correction amplifier 29 whose output potential is imposed on the gate of FET 23 to null the bridge.

In the first phase of operation in the automatic mode, switches $S_1$ and $S_2$ are opened under the control of the microprocessor to isolate DUT 10 from the bridge, the bridge then being nulled with respect to the spurious current component. The potential necessary to effect nulling in the first phase is stored in the microprocessor.

In the second phase, the microprocessor acts to close switches $S_1$ and $S_2$ to connect DUT 10 directly into the bridge, and the bridge is again nulled, this time with respect to the bias current flowing in the operational amplifier, the current imbalance in the bridge being only that introduced by the bias current.

In this bridge arrangement, fixed resistors 20 and 21 need not have extremely high impedance values. Because they act to offset each other, they merely have to be matched, and a one megohm resistance is adequate for this purpose. But because the resistance of the DUT is in the order of $10 \times 10^{13}$ ohms, the resistance of the adjustable element 23 must be extremely high, this being provided by the inherently high impedance of the FET.

Since the bridge is controlled by a microprocessor, the first and second phase nulling cycles and the compensation for both thermal and ambient non-linearities may be programmed into the firm ware of the microprocessor and can be executed in a rapid sequential manner.

The electrometer amplifier 25 is included in a closed control loop between the output diagonals of the bridge and the gate-source circuit of the field effect transistor 23 forming the adjustable impedance element of the bridge. Since the bridge is a comparatively low impedance device and the field effect transistor is an essentially high impedance device, the time constants to make the minute digitized current adjustments are very small.

Thus a 10-bit A-D converter 26 and an 8-bit microprocessor 27 are adequate to execute the operation in real time of 100 microseconds per adjustment. This makes a measurement window of 0.1 picoamperes about 60 milliseconds, which time will generally outstrip the actual settling time of the front end of the Bi-FET operational amplifier.

A microprocessor is the central processing unit (CPU) of a computer with its associated circuitry that is scaled down by integrated-circuit techniques to fit on one or more silicon chips containing thousands of transistors, resistors or other electronic circuit elements. By combining a microprocessor with other integrated circuit chips that provide timing, random access memory, interfaces for input and output signals and other ancillary functions, one can thereby assemble all of the necessary components of a mini-computer whose master component is the microprocessor. The memory system is that component of a computer which holds data and instructions, each instruction or datum being assigned a unique address that is used by the CPU when fetching or storing the information.

The capability of a computer depends in good part on storage capacity of its memory system. The amount of information stored ranges from fewer than 100 bits to more than a billion bits for a large scale computer. Integrated-circuit memories based on transistors are designed to store bits or binary digits on a chip. Currently, the most advanced RAM chip that is available commercially has a maximum storage capacity of 16,384 bits.

The basic "hardware" components of a digital computer are the central processing unit (CPU), the memory system and the input-output (I/O) device. The registers, the control and the arithmetic logic unit of the CPU is linked with the memory system and the I/O device by a data bus; that is a group of wires that allows the memory the CPU and I/O to exchange "words."

The "software" associated with a computer are those expedients by which the computer is explicitly told what to do through a step-by-step sequence of individual instructions which together constitute a program to perform some specific function to yield a solution to a specific problem. An "instruction" is a group of bits that define a particular computer operation. Thus an arrangement may direct a computer to move data, to carry out arithmetic and logic operations, to control I/O devices, or to make a decision as to which instruction is to be executed next.

There are many microprocessors presently on the market capable of performing the function of microprocessor 27, these ranging from small 4-bit devices to 16-bit super-fast microprocessors. The present trend is toward 8-bit systems. Suitable for microprocessor 27 is an INTEL 8080A or an INTEL 8085, these being 8-bit machines. Also acceptable are a Motorola 6800, an 8-bit machine similar to INTEL's 8080A and a Fairchild F8, an 8-bit machine in which a complete processor is provided on two chips.

Though the system in accordance with the invention has been described as measuring the values of extremely high impedance devices, since the bridge networks illustrated are d-c operated, the values measured in ohms are actually directcurrent resistances. In practice, however, the bridge may be powered by a stable source of high-frequency current to afford true impedance measurement.

While there have been shown and described preferred embodiments of a bridge-balancing system for measuring extremely high impedances in accordance with the invention, it will be appreciated that many changes and modifications may be made therein without, however, departing from the essential spirit thereof.

I claim:

1. A bridge-balancing system for measuring direct current flow having an intensity in the sub-nanoampere range passing through a device under test having an extremely high impedance, said system comprising:
   A. a bridge network having two sets of opposing arms to define input and output diagonals, one set of arms being constituted by a pair of fixed resistors having matching values, the first arm in the other set being formed by the device under test and the second arm by an adjustable impedance element formed by an MOS field-effect transistor having gate, source and drain electrodes, said transistor, at predetermined values of direct voltage applied to the drain relative to the source, operating in the variable resistance region in which the impedance presented between the drain and source electrodes inserted in said second arm depends on the potential imposed on the gate;
   B. means to apply a constant direct voltage across the input diagonals of the network to cause said transistor to operate in the variable resistance region;
   C. an amplifier having a high input impedance connected across the output diagonals of the network to produce an analog signal whose sense and magnitude depend on the difference between the impedance of the device and that of the field-effect transistor; and
   D. means to impose a potential on said gate having a level which brings the network into balance and nulls said signal.

2. A system as set forth in claim 1, wherein said amplifier is the front end of an electrometer which indicates said analog signal.

3. A system as set forth in claim 1, wherein said device is an operational amplifier.

4. A system as set forth in claim 3, wherein said operational amplifier has inverting and non-inverting terminals which are connected into the first arm of said network, whereby the system measures the impedance across the terminals.

5. A system as set forth in claim 3, wherein said operational amplifier has inverting and non-inverting terminals which are selectively connected to the first arm of said network to measure the impedance between each terminal and ground.

6. A system as set forth in claim 1, operable in the automatic mode and further including a microprocessor, means to convert said analog signal into a corresponding digital value and to apply said value into said microprocessor for evaluation therein to determine the potential necessary to null said signal, said microprocessor yielding a digital instruction which is converted into a corresponding analog control signal that is applied to a correction amplifier to produce the nulling potential which is imposed on said gate.

7. A system as set forth in claim 6, wherein the device under test is an operational amplifier having inverting and non-inverting terminals which are connected through respective high impedance switches into said first arm of the network, whereby when the switches are open, the bridge may be nulled with respect to parasitic currents, and when the switches are closed, the bridge may be nulled with respect to the bias current flowing through said device.

* * * * *